US006969665B2

(12) United States Patent
Cha

(10) Patent No.: US 6,969,665 B2
(45) Date of Patent: Nov. 29, 2005

(54) METHOD OF FORMING AN ISOLATION FILM IN A SEMICONDUCTOR DEVICE

(75) Inventor: Jae Han Cha, Cheongjoo-Shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 122 days.

(21) Appl. No.: 10/612,074

(22) Filed: Jul. 3, 2003

(65) Prior Publication Data

US 2004/0087105 A1 May 6, 2004

(30) Foreign Application Priority Data

Nov. 5, 2002 (KR) ................................ 10-2002-0068052

(51) Int. Cl.[7] ................................................ H01L 21/76
(52) U.S. Cl. ........................ 438/424; 438/429; 438/433
(58) Field of Search ................................ 438/424, 429, 438/FOR 227, 433

(56) References Cited

U.S. PATENT DOCUMENTS

| | | | | |
|---|---|---|---|---|
| 4,926,233 A | * | 5/1990 | Hutter | 257/370 |
| 6,399,992 B1 | * | 6/2002 | Matsumoto et al. | 257/369 |
| 6,436,791 B1 | * | 8/2002 | Lin et al. | 438/424 |
| 6,528,379 B2 | * | 3/2003 | Takada et al. | 438/322 |
| 6,682,967 B2 | * | 1/2004 | Matsumoto et al. | 438/224 |

FOREIGN PATENT DOCUMENTS

| | | | | |
|---|---|---|---|---|
| JP | 02203549 A | * | 8/1990 | ........... H01L/21/76 |
| KR | 990028402 | | 7/1999 | ........... H01L/21/76 |

OTHER PUBLICATIONS

S. J. Ahn, et al.; "Novel DRAM Cell Transistor with Asymmetric Source and Drain Junction Profiles Improving Data Retention Characteristics"; 2002 Symposium On VLSI Technology Digest of Technical Papers; pp. 176–177.

* cited by examiner

Primary Examiner—George Fourson
Assistant Examiner—Michelle Estrada
(74) Attorney, Agent, or Firm—Piper Rudnich LLP

(57) ABSTRACT

Disclosed is a method of forming an isolation film in a semiconductor device. The method comprises the steps of providing a semiconductor substrate having a region where a P well will be formed and a region where a N well will be formed, forming an oxide film and a nitride film on the semiconductor substrate, removing portions of the nitride film and the oxide film and the semiconductor substrate below them to form first and second trenches in the region where the P well will be formed and the region where the N well will be formed, respectively, implementing an epitaxial growth process including a doping process to form a N type epitaxial growth layer in the first trench and a P type epitaxial growth layer in the second trench, and burying the first and second trenches with insulating films to form an isolation film.

14 Claims, 2 Drawing Sheets

METHOD OF FORMING AN ISOLATION FILM IN A SEMICONDUCTOR DEVICE

BACKGROUND OF THE INVENTION

1. Field of the Invention

The present invention relates to a method of forming an isolation film in a semiconductor device, and more particularly, to a method of forming an isolation film in a semiconductor device capable of preventing a junction leakage in the semiconductor device.

2. Background of the Related Art

A junction leakage in semiconductor devices causes to not only increase the standby current of a logical device, thus consuming lots of the power but also degrade a retention (refresh margin reduction) characteristic of the semiconductor device having memory cells.

A cause of the reverse biased junction leakage, which has been well known in the art, is generation current (Igen) due to electron-hole creation and recombination at the space charge region or the depletion region of semiconductor junctions (PN or NP) of opposite types ("MOSFET Models for VLSI Circuit Simulation Theory and Practice", Narain Arora, p50~51), as shown in FIG. 1.

This generation current (Ign) is principally generated due to thermal activation even at ideal semiconductors having no any defect. This could be controlled by only changing the type of the semiconductor substrate. However, additional electron and hole trap (or creation) centers are created due to various kinds of semiconductor device defects (vacancy, interstitial and dislocation, which cause lattice defect of the substrate, a dangling bond existing at the interface of the semiconductor substrate and the insulating film, and the like) that are caused by the process of manufacturing the semiconductor device. These cause to significantly increase the junction leakage.

An effort to minimize the junction leakage has been made generally and widely on the device manufacture processes of all the kinds including an implantation process for controlling the concentration of the substrate, an annealing process, a cleaning process, an etch process, a deposition process for minimizing a film stress, and the like. Further, it was known that a main location where the junction leakage occurred is collectively distributed at a boundary region of the semiconductor substrate and the isolation insulating film upon a shallow trench isolation (STI) process (LOCOS, local oxidation of silicon). Due to this, it is common to include various complicated cleaning, oxidization, etch processes, etc. for reducing defects in this region. As one example, in the method of manufacturing the cell transistor for manufacturing a DRAM memory cell, an effort for improving the retention characteristic of the DRAM by making different the junction structure of the source and drain is in progress. (Novel DRAM Cell Transistor With Asymmetric Source and Drain Junction Profiles Improving Data Retention Characteristics", S. J. Ahn, 2002 Symposium on VLSI Technology Digest of Technical Papers, p176). However, this method has problems that it is more complicated than the existing method, unnecessarily increases the number of process and thus increases the production period and cost. Further, this method does not fundamentally remove the semiconductor substrate defect generated at the boundary region of the isolation insulating film and the semiconductor region. Accordingly, this method could be not a solution to fundamentally remove the junction leakage.

SUMMARY OF THE INVENTION

Accordingly, the present invention is contrived to substantially obviate one or more problems due to limitations and disadvantages of the related art, and an object of the present invention is to provide a method of forming an isolation film in semiconductor devices by which before a burial process of an insulating film after a STI etch process for forming the isolation film is completed, a N type doping process is implemented for a region where a NMOS is formed and a P type doping process is implemented for a region where a PMOS is formed, whereby N+ source/drain of the NMOS and a junction depletion region of the P well is prevented from being formed at the boundary region of the STI, and the substrate defect at this region could not be used as a trap center increasing the junction leakage accordingly.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming an isolation film in semiconductor devices according to the present invention is characterized in that it comprises the steps of providing a semiconductor substrate having a region where a P well will be formed and a region where a N well will be formed, forming an oxide film and a nitride film on the semiconductor substrate, removing portions of the nitride film and the oxide film and the semiconductor substrate below them to form first and second trenches in the region where the P well will be formed and the region where the N well will be formed, respectively, implementing an epitaxial growth process including a doping process to form a N type epitaxial growth layer in the first trench and a P type epitaxial growth layer in the second trench, and burying the first and second trenches with insulating films to form an isolation film.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 1:
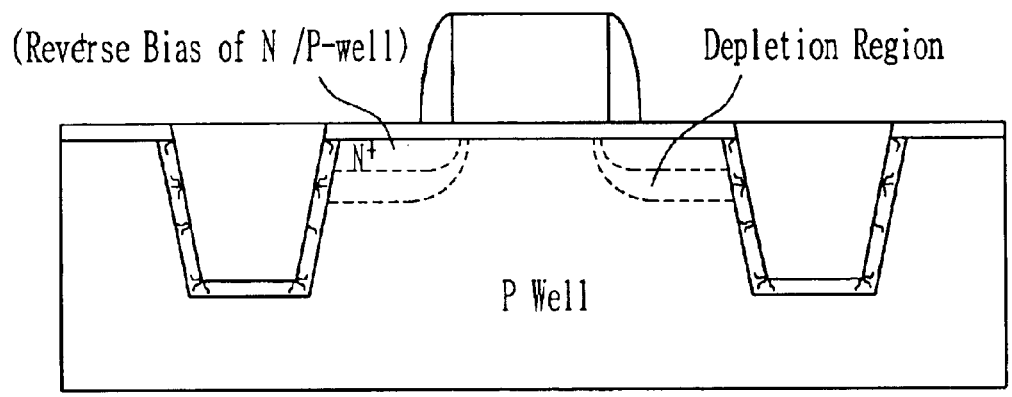
FIG. 1 is a cross-sectional view of a conventional semiconductor device for schematically illustrating a depleting region formed at the interface of an isolation film and a semiconductor substrate.
Figure 2A:
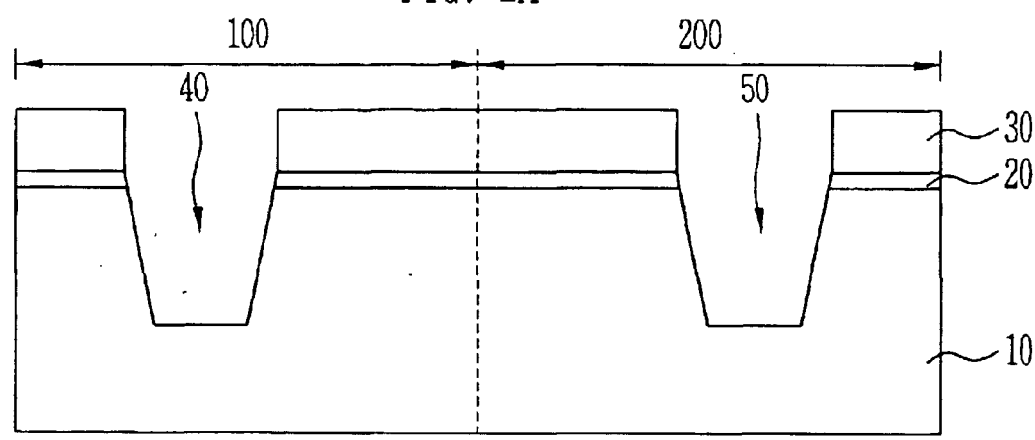
FIG. 2A~FIG. 2C are cross-sectional views of semiconductor devices for explaining a method of forming an isolation film in the device according to a preferred embodiment of the present invention.
Figure 2B:
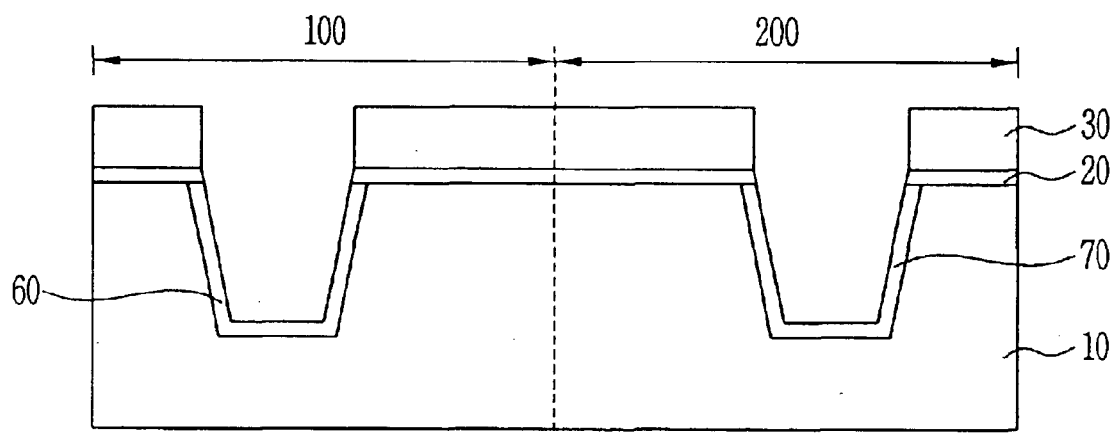
Figure 2C:
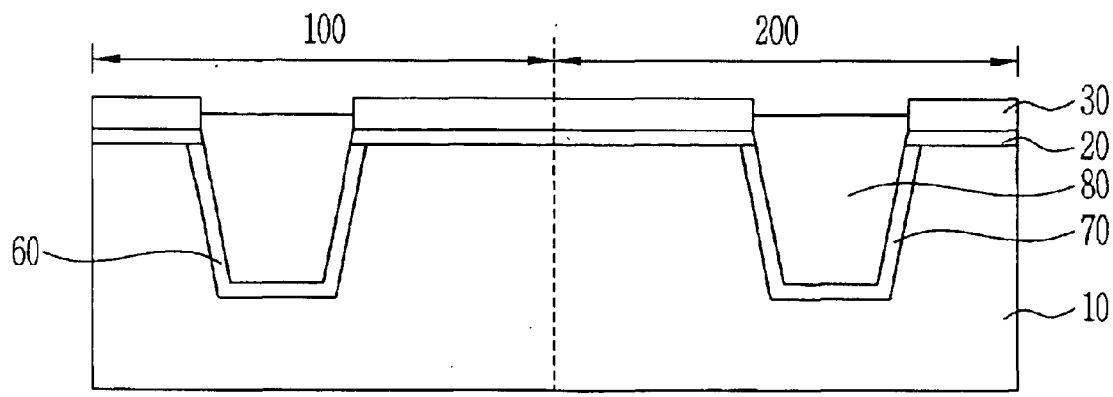

FIG. 2A~FIG. 2C are cross-sectional views of semiconductor devices for explaining a method of forming an isolation film in the device according to a preferred embodiment of the present invention.

Referring to FIG. 2A, an oxide film 20 and a nitride film 30 are formed on a semiconductor substrate 10. For insulation between unit devices, trenches 40 and 50 are formed in a region where a N well will be formed 100 and a region where a P well will be formed 200, by means of a photo mask process and an etch process. At this time, the oxide film 20 and the nitride film 30 may be formed after the trenches 40 and 50 are formed.

By reference to FIG. 2B, a silicon epitaxial growth process using the oxide film 20 and the nitride film and 30 in the region where the N well will be formed 100 as a silicon epitaxial anti-growth film is implemented. During the silicon epitaxial growth process, a doping gas of the same kind to the N well may be supplied in-situ. Also, after the silicon epitaxial growth process, an ion implantation process of the same kind to the N well may be implemented. At this time, the doping concentration is significantly higher than those of the N well. Thereby, a N type doping silicon layer 60 is formed in the semiconductor substrate 10 within the trench 40.

Thereafter, a silicon epitaxial growth process using the oxide film 20 and the nitride film 20 in the region where the P well will be formed 200 as a silicon epitaxial anti-growth film is implemented. During the silicon epitaxial growth process, a doping gas of the same kind to the P well may be supplied in-situ. Also, after the silicon epitaxial growth process, an ion implantation process of the same kind to the P well may be implemented. At this time, the doping concentration is significantly higher than those of the P well. Thereby, a P type doping silicon layer 70 is formed in the semiconductor substrate 10 within the trench 50.

The above doping process may be performed during the ion implantation process for forming the well within the semiconductor substrate. Further, though explanation has given by taking the silicon epitaxial process as an example in the above process, an epitaxial growth method using materials that could be coupled such as N type SiGe, P type SiGe, N type SiC, P type SiC, N type SiCGe, P type SiCGe, etc., which are different from the semiconductor substrate.

Referring to FIG. 2C, an insulating film 80 for STI is deposited (pre-cleaning process) within the trenches 60 and 70. A smoothing process using a chemical mechanical polishing process is implemented to complete the STI isolation insulating film.

In the above process, energy may be changed upon the ion implantation process so that distribution of the doping concentration in the doping process is advertently differentiated toward the semiconductor substrate facing the isolation insulating film. Further, during the doping process included in the process of forming the epitaxial growth layer, concentration distribution of the doping source gas is advertently controlled.

As described above, when the transistor operates, a reverse junction leakage between the source, drain and well can be significantly reduced by forming the doping epitaxial silicon layer on the semiconductor substrate in the isolation region. Therefore, power consumption of the device can be minimized, device characteristics suitable for implementation of mobile related products could be satisfied and a retention characteristic of the semiconductor device including the cell could be improved. Due to this, the present invention can has advantageous effects that it can significantly reduce soft error and significantly improve reliability of the device. Further, this directly affects a Cs/Cb Ratio depending on higher-integration of the single DRAM. Therefore, the present invention can has a new effect that it can relatively increase cell capacitance.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of forming an isolation film in a semiconductor device, comprising the steps of:

forming trenches for isolation at regions where wells will be formed on a semiconductor substrate;

forming an epitaxial growth layer on the semiconductor substrate within the trench, wherein during formation of the epitaxial growth layer, a doping gas of the same kind to the well is used as source gas; and burying the trenches with insulating films to form an isolation film.

2. The method as claimed in claim 1, further comprising the step of implementing an ion implantation process for implanting a dopant of the same kind to the well, after the epitaxial growth layer is formed.

3. The method as claimed in claim 1, wherein the epitaxial growth layer is formed using one of N type SiGe, P type SiGe, N type SiC, P type SiC, N type SiCGe and P type SiCGe.

4. The method as claimed in claim 2, wherein the ion implantation process is simultaneously formed with the ion implantation process for forming the well.

5. A method of forming an isolation film in a semiconductor device, comprising the steps of:

providing a semiconductor substrate having a region where a P well will be formed and a region where a N well will be formed;

forming an oxide film and a nitride film on the semiconductor substrate;

removing portions of the nitride film and the oxide film and the semiconductor substrate below them to form first and second trenches in the region where the P well will be formed and the region where the N well will be formed, respectively;

implementing an epitaxial growth process including a doping process to form a N type epitaxial growth layer in the first trench and a P type epitaxial growth layer in the second trench; and burying the first and second trenches with insulating films to form an isolation film.

6. The method as claimed in claim 5, wherein the N type epitaxial growth layer is formed by simultaneously implementing an epitaxial growth process including a process of implanting ions of the same kind to the N well.

7. The method as claimed in claim 5, wherein the N type epitaxial growth layer is formed by implementing a process of implanting ions of the same kind to the N well after the epitaxial growth process is performed.

8. The method as claimed in claim 5, wherein the P type epitaxial growth layer is formed by simultaneously implementing an epitaxial growth process including a process of implanting ions of the same kind to the P well.

9. The method as claimed in claim 5, wherein the P type epitaxial growth layer is formed by implementing a process of implanting ions of the same kind to the P well after the epitaxial growth process is performed.

10. The method as claimed in claim 6, wherein the doping concentration of the N type epitaxial growth layer is higher than those of the N well.

11. The method as claimed in claim 7, wherein the doping concentration of the N type epitaxial growth layer is higher than those of the N well.

12. The method as claimed in claim 8, wherein the doping concentration of the P type epitaxial growth layer is higher than those of the P well.

13. The method as claimed in claim 9, wherein the doping concentration of the P type epitaxial growth layer is higher than those of the P well.

14. The method as claimed in claim 6, wherein energy is changed upon the ion implantation process so that distribution of the doping concentration in the doping process is advertently differentiated toward the semiconductor substrate facing the isolation insulating film, and during the doping process included in the process of forming the epitaxial growth layer, concentration distribution of the doping source gas is advertently controlled.

* * * * *